(12) United States Patent
Machnicki

(10) Patent No.: US 9,413,353 B2
(45) Date of Patent: Aug. 9, 2016

(54) THERMAL VOLTAGE MARGIN RECOVERY

(71) Applicant: Apple Inc., Cupertino, CA (US)

(72) Inventor: Erik P Machnicki, San Jose, CA (US)

(73) Assignee: Apple Inc., Cupertino, CA (US)

( * ) Notice: Subject to any disclaimer, the term of this patent is extended or adjusted under 35 U.S.C. 154(b) by 305 days.

(21) Appl. No.: 14/275,473

(22) Filed: May 12, 2014

(65) Prior Publication Data

US 2015/0326216 A1    Nov. 12, 2015

(51) Int. Cl.
| | |
|---|---|
| *H03K 19/003* | (2006.01) |
| *H03K 17/14* | (2006.01) |
| *G05B 13/02* | (2006.01) |
| *G01K 3/00* | (2006.01) |

(52) U.S. Cl.
CPC ........ *H03K 19/00369* (2013.01); *G05B 13/021* (2013.01); *H03K 17/14* (2013.01); *Y10T 307/773* (2015.04)

(58) Field of Classification Search
CPC ...................................................... G01K 3/00
USPC .............................................................. 307/4
See application file for complete search history.

(56) References Cited

U.S. PATENT DOCUMENTS

| | | |
|---|---|---|
| 5,994,752 A | 11/1999 | Sander et al. |
| 7,087,439 B2 | 8/2006 | Ku |
| 7,569,904 B2 | 8/2009 | Oh et al. |
| 2013/0076381 A1 | 3/2013 | Takayanagi et al. |
| 2014/0062533 A1 | 3/2014 | Takayanagi |

*Primary Examiner* — Robert Deberadinis
(74) *Attorney, Agent, or Firm* — Meyertons, Hood, Kivlin, Kowert & Goetzel, P.C.; Erik A. Heter

(57) ABSTRACT

A method and apparatus for thermal voltage margin recovery is disclosed. In one embodiment, an integrated circuit (IC) includes first and second temperature sensors at first and second locations of the IC, respectively. The IC further includes a power management circuit coupled to receive temperature readings from the first and second temperature sensors. Based on received temperature readings, the power management circuit may determine a voltage offset value. The power management circuit may then reduce the operating voltage of the IC by the voltage offset value.

20 Claims, 6 Drawing Sheets

| Min Temp Region | Max Temp Region | Final Offset |
|---|---|---|
| 0 | 0 | Offset 0 |
| 0 | 1 | Min (Offset 0, Offset 1) |
| 0 | 2 | Min (Offset 0, Offset 1, Offset 2) |
| 0 | 3 | Min (Offset 0, Offset 1, Offset 2, Offset 3) |
| 1 | 1 | Offset 1 |
| 1 | 2 | Min (Offset 1, Offset 2) |
| 1 | 3 | Min (Offset 1, Offset 2, Offset 3) |
| 2 | 2 | Offset 2 |
| 2 | 3 | Min (Offset 2, Offset 3) |
| 3 | 3 | Offset 3 |

Fig. 4

THERMAL VOLTAGE MARGIN RECOVERY

BACKGROUND

1. Technical Field

This disclosure relates to integrated circuits, and more particularly, to adjustments of operating voltage based on a temperature of an integrated circuit.

2. Description of the Related Art

Advances in integrated circuit (IC) technology have increased the number of transistors on a single IC chip. The operating frequencies of some IC chips have also increased. The large number of transistors and increase in operating frequency has resulted in a corresponding increase in power consumption by IC chips. A corresponding increase in thermal output has also accompanied the increase in transistor count and operating frequency.

Management of power consumption and thermal output has increase in importance with the above-mentioned advances in IC technology. This is particularly true for portable devices that may rely on a battery for at least some of their operation. One manner in which power may be saved is to reduce the operating voltage of an IC. The power consumption by a given IC can be calculated as the square of the operating voltage. Accordingly, reduction of the operating voltage can have a significant impact on power consumption.

SUMMARY

A method and apparatus for thermal voltage margin recovery is disclosed. In one embodiment, an integrated circuit (IC) includes first and second temperature sensors at first and second locations of the IC, respectively. The IC further includes a power management circuit coupled to receive temperature readings from the first and second temperature sensors. Based on received temperature readings, the power management circuit may determine a voltage offset value. The power management circuit may then reduce the operating voltage of the IC by the voltage offset value.

In one embodiment, the power management circuit may determine which region or regions the temperature readings fall within. The temperature regions (or ranges of temperatures) may be defined by a number of different threshold values, with each region bound by a lower value and an upper value. Based on the regions in which the temperature readings fall, as well as any spread therebetween, the power management circuit may select the voltage offset value from one or more possible values. The power management circuit may select the minimum offset value and may reduce the operating voltage by this amount. This may allow for recovery of some of the margin of extra voltage that may have been added to the operating voltage to ensure safe operation. The amount of voltage that may be recovered may vary with the temperature of the IC. Accordingly, in determining the voltage offset to be applied, the power management circuit may select an offset by which the operating voltage may be reduced to provide power savings while also ensuring safe operation. This arrangement may also allow for the recovery of some voltage margin for arbitrary temperature-voltage curves, which can differ from one instance of an IC to the next.

BRIEF DESCRIPTION OF THE DRAWINGS

The following detailed description makes reference to the accompanying drawings, which are now briefly described.

FIG. 4 is a diagram illustrating one embodiment of a table stored in a memory of a power management circuit for an IC embodiment, the table being used in selection of a voltage offset.

Figure 1:
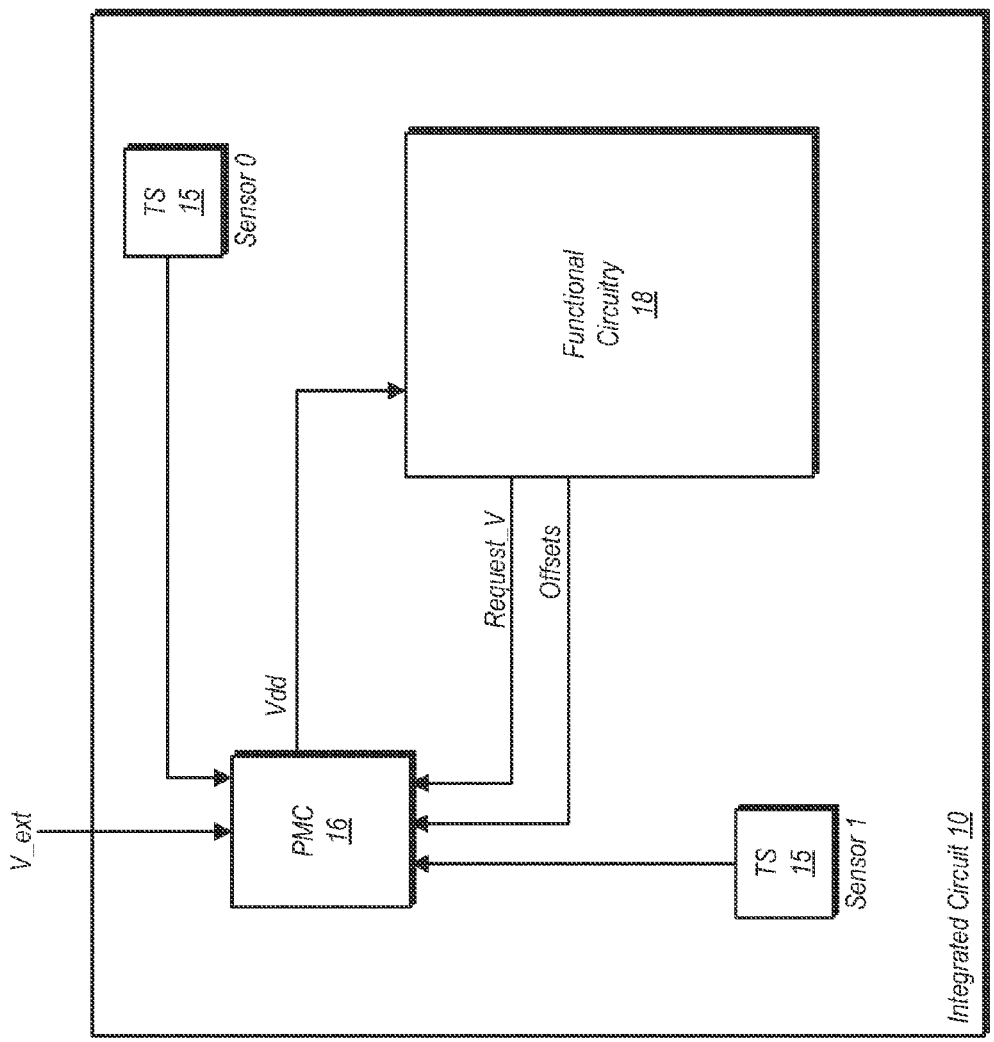
FIG. 1 is a block diagram of one embodiment of an integrated circuit (IC).

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component.

DETAILED DESCRIPTION OF EMBODIMENTS

Turning now to FIG. 1, a block diagram of one embodiment of an integrated circuit (IC) is shown. IC 10 is shown in FIG. 1 as a simplified block diagram for illustrative purposes. However, many variations of IC 10 that fall within the scope of this disclosure are possible and contemplated. IC 10 in this embodiment includes two instances of temperature sensor 15, a power management circuit 16, and functional circuitry 18. Additional temperature sensors 15 may be included in some embodiments.

Functional circuitry 18 may include one or more circuit blocks or units. For example, functional circuitry 18 may include one or more processor cores, graphics processing circuitry, various types of memory (e.g., registers, random access memory), input/output (I/O) circuits, and so forth.

Each temperature sensor 15 in the embodiment shown is configured to sense a temperature within its general vicinity. Various types of circuitry may be used to implement temperature sensors 15. For example, a ring oscillator may be used to implement temperature sensors 15 in one embodiment. In general, any suitable type of temperature sensor circuitry may be used. Each temperature sensor 15 may provide to power management circuitry 16 a temperature reading indicative of the temperature within its general vicinity. Power management circuitry 16 may periodically read the temperatures provided from the temperature sensors 15.

Power management circuit 16 is configured to perform various power management functions, including the controlling of the level of the voltage Vdd supplied to the functional circuitry 18. Other power management functions may include power gating various circuit blocks within functional circuitry 18, controlling the gating of clock signals, and so forth. In general, power management circuit 16 may be configured to perform a number of different functions to control and optimize power consumption by IC 10.

In this particular embodiment, power management circuit 16 may receive power from an external voltage source, V_ext. Power management circuit 16 may include an adjustable voltage regulator or other circuit that enables adjustment of this voltage, which may then be supplied to functional circuit 18 as Vdd. Among the various inputs that may cause a change in the voltage Vdd is a request for a voltage change from functional circuitry 18 via the signal Request_V. Another input that may cause a change is a change in temperature determined by power management circuitry 16 during its periodic readings of the temperatures reported by temperature sensors 15. Functional circuitry 18 may be configured to request a change to voltage for various reasons, such as a performance increase or decrease. As will also be explained below, functional circuitry 18 may provide voltage offset values to power management circuit 16. The voltage offset values may be used in reducing an operating voltage at a particular operating point.

The level at which the voltage Vdd is output by power management circuit 16 may be at least partially dependent on temperature readings received from temperature sensors 15. In one embodiment, based on the temperature readings received from temperature sensors 15, power management circuitry 16 may reduce the operating voltage Vdd by a specified amount in order to recover additional voltage margin that may have been added. The amount of the voltage reduction may be based on particular of the temperatures determined from the temperature readings, as well as the requested voltage and known safe operating voltages. The known safe operating voltages may be determined using various methods, such as characterization tests conducted on various instances of IC 10 subsequent to the manufacturing process. Since the characterization tests may yield different results for one instance of IC 10 to another, the voltage margin recovery method and apparatus discussed herein may be designed to function with arbitrary voltage-temperature curves.

In one embodiment, power management circuit 16 may, based on temperature readings received from the temperature sensors 15 (Sensor 0 and Sensor 1), determine a current maximum possible temperature and current a minimum possible temperature for IC 10. Based on these maximum and minimum possible temperatures, a determination of a temperature region (or range) for each of these values may be determined. Based on the various temperature regions, a requested operating voltage, and a number of possible voltage offset values, power management circuit 16 may select a voltage offset value. The operating voltage may then be set at a voltage that is equal to the requested operating voltage minus the voltage offset value. Various embodiments of this methodology are discussed in further detail below.

Figure 2:
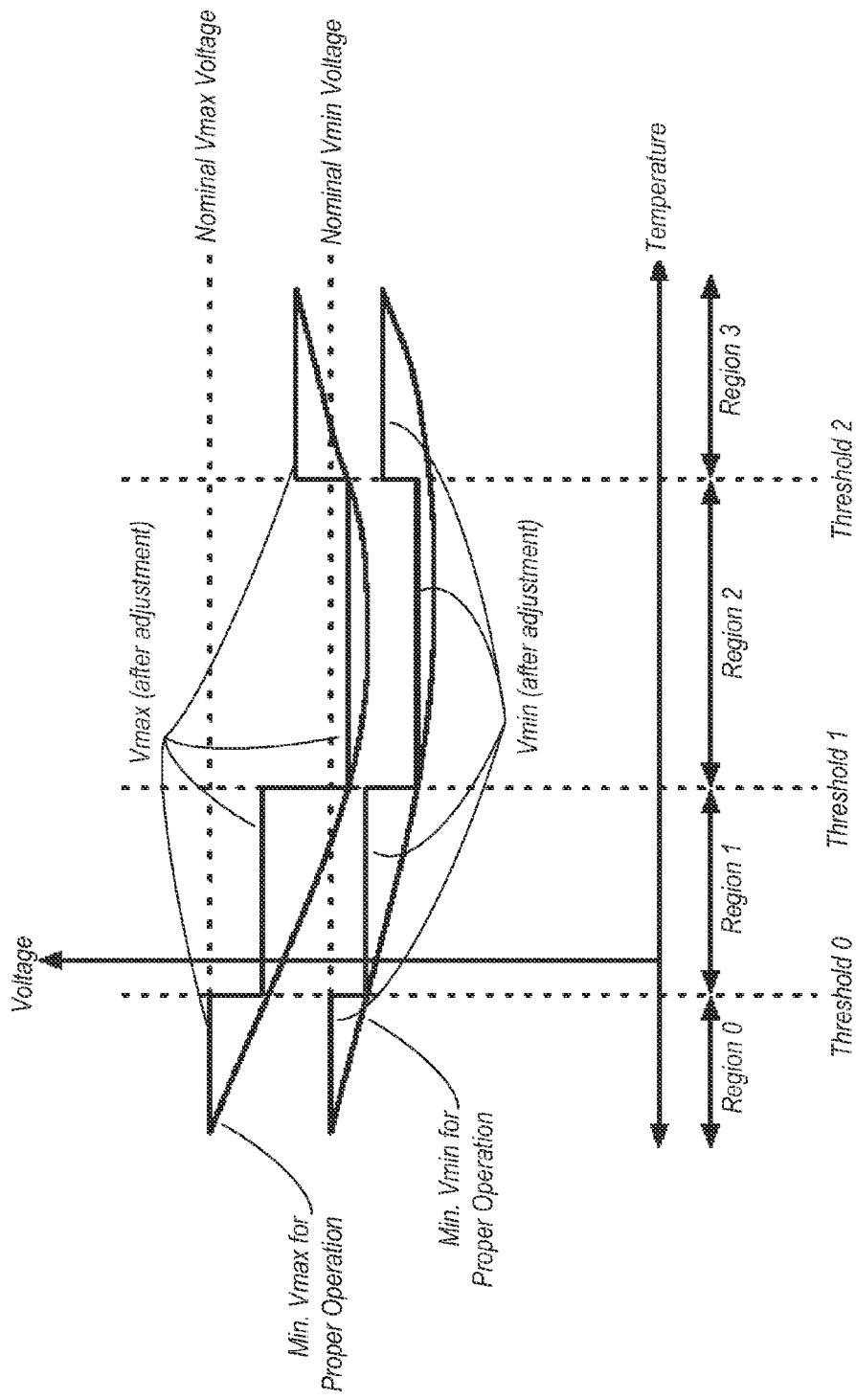
FIG. 2 is a graph illustrating a temperature-voltage curve for one embodiment of an IC.

FIG. 2 is a graph illustrating a temperature-voltage curve for one embodiment of an IC. In the illustrated example, two separate curves of voltage (vertical axis) vs. temperature (horizontal axis) are shown. The curves include a minimum value of Vmax for proper operation and a minimum value of Vmin for proper operation. These two curves may be determined by characterization tests or other suitable methods, and represent voltages at which the IC was determined to properly operate at various temperatures.

In this particular example, the temperature-voltage curve is inverted in that at the lowest and highest temperatures, the minimum safe operating voltages are higher than those in the middle of the curve. The temperature axis in this example is divided up into regions (or ranges) that are separated from one another by various temperature thresholds. In this example, Region 0 extends from zero up to Threshold 0, Region 1 extends between Threshold 0 and Threshold 1, Region 2 extends between Threshold 1 and Threshold 2, and Region 3 extends from Threshold 2 upward. In various embodiments of an IC, the number of thresholds and regions may be different than in the example shown here.

The graph also illustrates Vmax and Vmin voltages, after adjustment, in each of the regions. The difference between these two voltages may represent a range of operating voltages within that particular region at which the IC may be safely operated after reduction by an offset value. In Region 0, the Vmax and Vmin voltages are equal to the nominal Vmax and Vmin voltages, which may represent no reduction by any offset value. In Regions 1, 2, and 3, the Vmax and Vmin voltages, after adjustment, are less than the nominal Vmax and Vmin voltages, respectively. Thus, in these regions, the operating voltage may be reduced from one of the nominal values to a corresponding one of the adjusted values, or at a value therebetween. This may result in power savings during operation of the IC.

Figure 3:
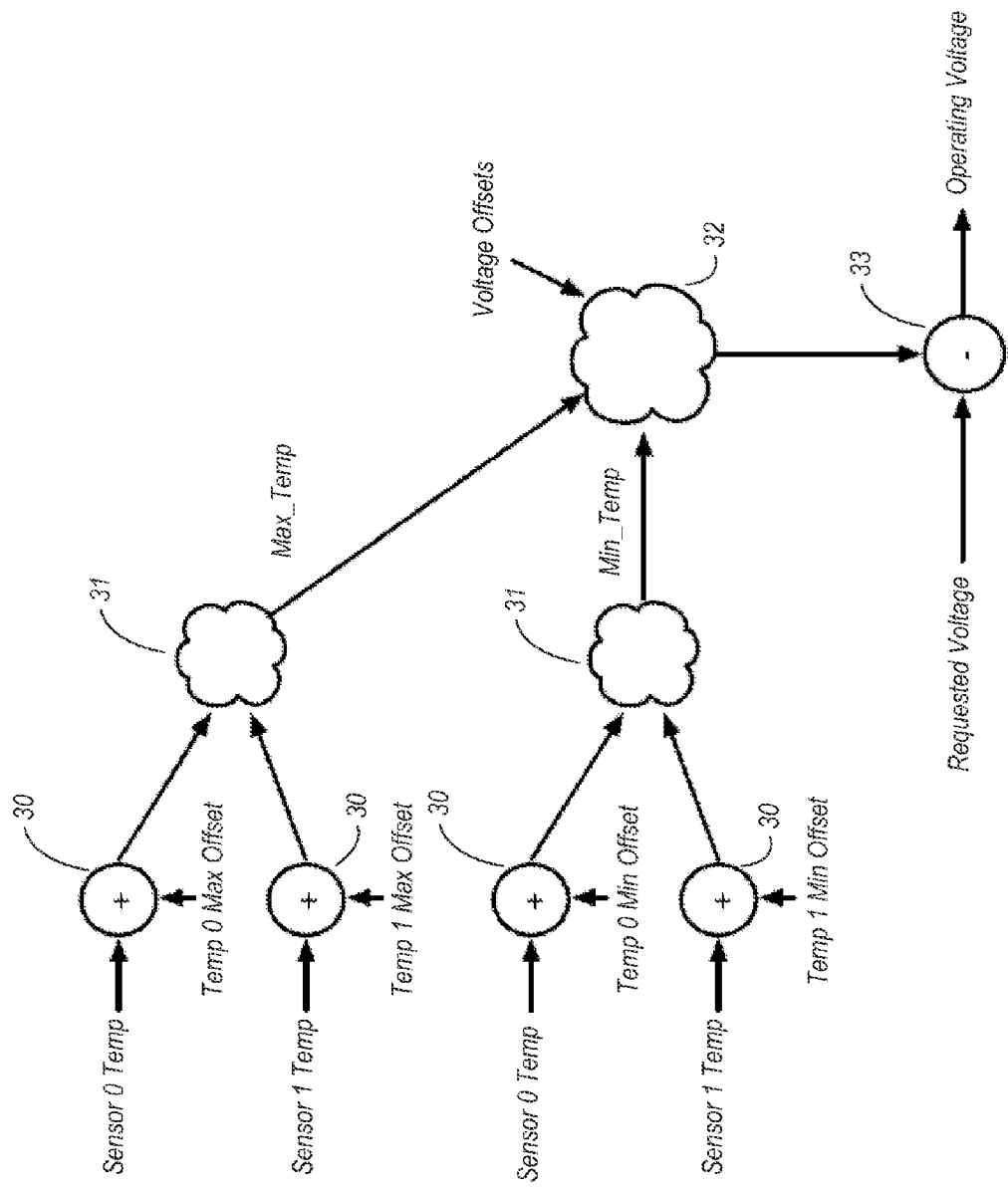
FIG. 3 is a diagram illustrating the selection of a voltage offset for one embodiment of an IC.

Moving now to FIG. 3, a diagram illustrating the selection of a voltage offset for one embodiment of an IC is shown. More particularly, FIG. 3 in this example illustrates the operation of power management circuitry 16 in setting the operating voltage for functional circuitry 18 (as shown in FIG. 1), but may apply to other embodiments of an IC as well. In the example shown, a maximum and a minimum temperature may be determined. Based on the determined maximum and minimum temperatures, a voltage offset may be determined (if in an appropriate temperature region) and the resulting operating voltage may be correspondingly reduced.

Temperature readings from Sensor 0 and Sensor 1 may be provided to adders 30 as shown in the illustrated example. In a first adder 30, the temperature reading from Sensor 0 may be combined with a first maximum offset (Temp 0 Max Offset). The temperature reading from Sensor 1 may be provided to a second adder 30, and combined with a second maximum offset (Temp 1 Max Offset). It should be noted that the offset values may be positive or negative. These offsets may be provided from registers implemented in power management circuit 16 or elsewhere in IC 10, and may be determined during a characterization test, other testing, or may be pre-programmed values. The output of these two adders 30 may be provided to a comparator 31, which may compare the two values, and provide the greater of the two values as Max_Temp to another comparator 32.

Temperature readings from Sensor 0 and Sensor 1 are also provided to another pair of adders 30 and combined with a first minimum offset (Temp 0 Min Offset) and a second minimum offset (Temp 1 Min Offset), respectively. The resulting values are provided to a comparator 31, which selects the lesser of the two values to be provided as a minimum temperature value, Min_Temp, to comparator 32.

Comparator 32 may receive both the minimum and maximum temperature values, along with corresponding voltage offset values from, e.g., functional circuitry 18 in IC 10. The voltage offset values may be based at least in part on current or expected performance state of the processor. Different performance states may provide different voltage offsets for consideration in the voltage margin recovery process. The performance state may include such factors as processing workload, memory accesses, or other factors that may benefit from one particular voltage level over another.

A spread between the minimum and maximum temperatures may be determined, and a group of pertinent voltage offsets may be determined from this spread. Comparator 32 may determine the minimum voltage offset value from the group of pertinent voltage offsets, and provide this value to subtractor 33. The minimum voltage offset may then be subtracted from a requested operating voltage value (Requested Voltage), and the resulting value may be output as the operating voltage. Power management circuit 16 may then set the operating voltage to this value.

FIG. 4 is a diagram illustrating one embodiment of a table stored in a memory of a power management circuit for an IC embodiment, the table being used in selection of a voltage offset. Table 40 in the embodiment shown may be used by comparator 32 as shown in FIG. 3 to determine the final voltage offset value to be used in reducing the operating voltage. The offset values may be received from, e.g., functional circuitry 18 or another source, and in some embodiments, may vary with a desired operating point, a performance state, or other parameter.

Comparator 32 may select a row from the table based on the regions of the maximum and minimum temperatures determined as explained above. Based on the respective regions of the maximum and minimum temperatures as determined, an offset value may be selected. The number of possible offset values may vary with the spread between the maximum temperature region and the minimum temperature region. Each region may be associated with a corresponding offset value.

In the case that both the maximum and minimum temperatures are in the same region, the corresponding offset is selected. For example, in the first row of table 40, both the maximum and minimum temperatures are in Region 0. Accordingly, offset 0 is selected and applied as the voltage offset value by which the operating voltage may be reduced.

If the regions in which the maximum and minimum temperatures fall are different, then comparator 32 may select the minimum offset of all possible offsets. Using the second row of table 40 as an example, the minimum temperature region is Region 0, while the maximum temperature region is Region 1. The offsets corresponding to Region 0 and Region 1 are, respectively, Offset 0 and Offset 1. Comparator 32 may select the minimum value of Offset 0 and Offset 1 to be provided as the voltage offset value.

The number of offsets available for selection may vary with the spread between the maximum and minimum regions. Using the fourth row of the table, the minimum temperature region is Region 0, while the maximum temperature regions is Region 3 (i.e. the lowest and highest temperature regions, respectively, in this particular example). Accordingly, Offsets 0, 1, 2, and 3 are provided for determining the final offset value. Comparator 32 may select the minimum of these offset values to provide as the final voltage offset value.

Figure 5:
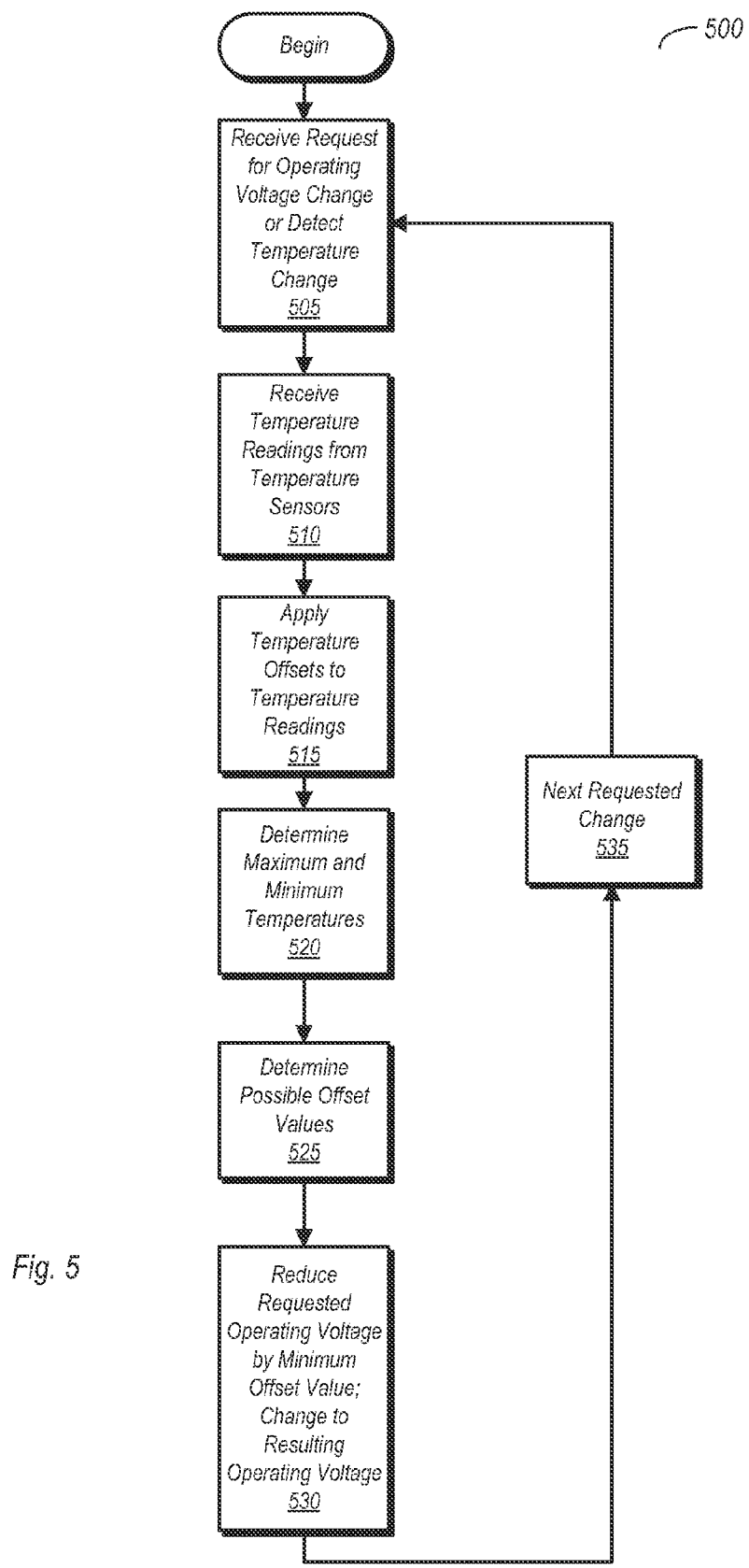
FIG. 5 is a flow diagram of one embodiment of a method for determining a voltage offset.

FIG. 5 is a flow diagram of one embodiment of a method for determining a voltage offset. Method 500 in the embodiment shown may be performed using various embodiments of the hardware discussed above. Furthermore, method 500 may also be performed using other hardware embodiments, or in embodiments that utilize both hardware and software.

Method 500 begins with the receipt of a request to change an operating voltage of an IC, or detection of a temperature change (block 505). The change request may be received by a power management circuit or other apparatus for controlling an operating voltage of an IC. The detection of a temperature change may occur by periodically monitoring the reported temperatures from the temperature sensors. The power management circuit may also receive temperature readings from temperature sensors located on the IC (block 510). The temperature sensors may be located in different areas. Since the temperature sensors may be uncalibrated, temperature offset values may be applied to the temperature readings (block 515). Using the values resulting from applying the temperature offsets to the temperature readings, maximum and minimum temperature values may be determine (block 520). Additionally, a determination of which temperature region(s) the maximum and minimum temperature readings fall within.

Based on the respective temperature regions of the maximum and minimum temperatures, a group of possible voltage offset values may be determined (block 525). For example, a table such as that discussed above in reference to FIG. 4 may be used to determine which possible voltage offsets may be applied to the requested operation voltage value. From among these possible voltage offsets, a minimum voltage offset value may be selected. Thereafter, the requested operating voltage may be reduced by the offset value, and the operating voltage may thus be changed to the requested operating voltage minus the offset value (block 530). The operating voltage may remain at this value until the next requested operating voltage change (block 535).

Figure 6:
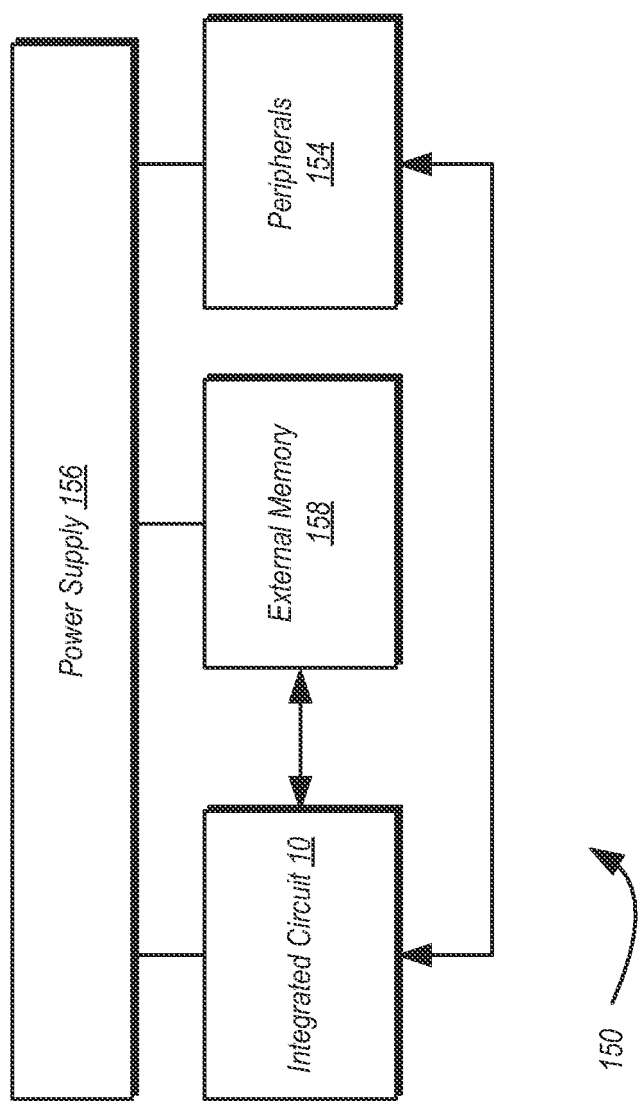
FIG. 6 is a block diagram of one embodiment of an exemplary system.

Turning next to FIG. 6, a block diagram of one embodiment of a system 150 is shown. In the illustrated embodiment, the system 150 includes at least one instance of the integrated circuit 10 coupled to external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMM5), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a first temperature sensor configured to determine a first temperature at a first location of the integrated circuit;
a second temperature sensor configured to determine a second temperature at a second location of the integrated circuit; and
a power management circuit coupled to the first and second temperature sensors, wherein the power management circuit is configured to select a voltage offset value based on the first and second temperatures and further configured to reduce an operating voltage of the integrated circuit by the voltage offset value.

2. The integrated circuit as recited in claim 1, wherein the power management circuit is configured to select the voltage offset value based on which one of a plurality of temperature ranges in which the first temperature falls and which one of the plurality of temperature ranges in which the second temperature falls.

3. The integrated circuit as recited in claim 2, wherein the power management circuit is configured to determine a minimum temperature range of the plurality of temperature ranges and a maximum temperature range of the plurality of temperature ranges based on the first and second temperatures, and configured to select a minimum voltage offset to provide as the voltage offset value based on a spread between the minimum temperature range and the maximum temperature range.

4. The integrated circuit as recited in claim 3, wherein the power management circuit includes a memory configured to store a table having a plurality of entries, wherein each of the plurality of entries includes a minimum temperature range value, a maximum temperature range value, and a minimum voltage offset value.

5. The integrated circuit as recited in claim 2, wherein the power management circuit is configured to determine a maximum temperature range of the plurality of temperature ranges based on applying a first maximum offset to the first temperature and a second maximum offset to the second temperature.

6. The integrated circuit as recited in claim 2, wherein the power management circuit is configured to determine a minimum temperature range of the plurality of temperature ranges based on applying a first minimum offset to the first temperature and a second minimum offset to the second temperature.

7. The integrated circuit as recited in claim 1, wherein the power management circuit is configured to determine the voltage offset value responsive to a request for a change to the operating voltage.

8. The integrated circuit as recited in claim 1, wherein the voltage offset value is further based on a current performance state of the integrated circuit.

9. A method comprising:
obtaining a first temperature reading from a first temperature sensor at a first location of an integrated circuit;
obtaining a second temperature reading from a second temperature sensor at a second location of the integrated circuit;
determining a voltage offset value based on the first and second temperature readings; and
reducing an operating voltage of the integrated circuit by the voltage offset value.

10. The method as recited in claim 9, further comprising selecting the voltage offset value based on which one of a plurality of temperature ranges in which the first temperature falls and which one of the plurality of temperature ranges in which the second temperature falls.

11. The method as recited in claim 10 further comprising:
determining a minimum temperature range of the plurality of temperature ranges and a maximum temperature range of the plurality of temperature ranges based on the first and second temperatures; and
selecting a minimum voltage offset to provide as a voltage offset value based on a spread between the minimum temperature range and the maximum temperature range.

12. The method as recited in claim 11, further comprising:
storing, in a memory of the integrated circuit, a table having a plurality of entries, wherein each of the plurality of entries includes a minimum temperature range value, a maximum temperature range value, and a minimum voltage offset value.

13. The method as recited in claim 10, further comprising:
determining a maximum temperature range of the plurality of temperature ranges based on applying a first maximum offset to the first temperature reading and a second maximum offset to the second temperature reading.

14. The method as recited in claim 10, further comprising:
determining a minimum temperature range of the plurality of temperature ranges based on applying a first minimum offset to the first temperature reading and a second minimum offset to the second temperature reading.

15. The method as recited in claim 9, further comprising:
determining the voltage offset value responsive to a request for a change to the operating voltage.

16. The method as recited in claim 9, wherein the voltage offset value further based on a current performance state of the integrated circuit.

17. An integrated circuit comprising:
a first temperature sensing circuit at a first location of the integrated circuit;
a second temperature sensing circuit at a second location of the integrated circuit; and
a power management circuit coupled to the first temperature sensing circuit and the second temperature sensing circuit,
wherein an operating voltage of the integrated circuit is reduced in response to a request to adjust the operating voltage by a voltage offset value selected based on which of a plurality of temperature ranges in which a first temperature reading from the first temperature sensing circuit falls and which of the plurality of temperature ranges a second temperature reading from the second temperature sensing circuit falls.

18. The integrated circuit as recited in claim 17, wherein a maximum one of the plurality of temperature ranges and a minimum one of the plurality of temperature ranges is determined and the voltage offset is selected based on a spread between the maximum and minimum ones of the plurality of temperature ranges.

19. The integrated circuit as recited in claim 18, wherein the voltage offset is further selected based on a current performance state of the integrated circuit.

20. The integrated circuit as recited in claim 17, wherein the voltage offset is selected from a minimum one of one or more offset values.

\* \* \* \* \*